(12) United States Patent
Jeter et al.

(10) Patent No.: US 11,527,269 B2
(45) Date of Patent: Dec. 13, 2022

(54) MEMORY CHANNELS CALIBRATION DURING BOOT WHEREIN CHANNELS ARE CALIBRATED IN PARALLEL BASED ON IDENTIFERS

(71) Applicant: Apple Inc., Cupertino, CA (US)

(72) Inventors: Robert E. Jeter, Santa Clara, CA (US); Rakesh L. Notani, Santa Clara, CA (US); Alma L. Juarez Dominguez, Campbell, CA (US)

(73) Assignee: Apple Inc., Cupertino, CA (US)

( * ) Notice: Subject to any disclaimer, the term of this patent is extended or adjusted under 35 U.S.C. 154(b) by 373 days.

(21) Appl. No.: 16/716,616

(22) Filed: Dec. 17, 2019

(65) Prior Publication Data

US 2021/0183414 A1     Jun. 17, 2021

(51) Int. Cl.
|   |   |
|---|---|
| *G11C 5/14* | (2006.01) |
| *G06F 11/07* | (2006.01) |
| *G06F 3/06* | (2006.01) |

(52) U.S. Cl.
CPC ............ *G11C 5/148* (2013.01); *G06F 3/0604* (2013.01); *G06F 3/0632* (2013.01); *G06F 3/0659* (2013.01); *G06F 3/0673* (2013.01); *G06F 11/0727* (2013.01); *G06F 11/0751* (2013.01); *G06F 11/0772* (2013.01); *G11C 5/141* (2013.01); *G11C 2207/2254* (2013.01)

(58) Field of Classification Search
CPC .... G06F 3/0604; G06F 3/0632; G06F 3/0659; G06F 3/0673; G06F 11/0727; G06F 11/0751; G06F 11/0772; G11C 5/148; G11C 5/141
See application file for complete search history.

(56) References Cited

U.S. PATENT DOCUMENTS

| | | | |
|---|---|---|---|
| 6,633,947 B1 | 10/2003 | Holman et al. | |
| 8,694,812 B2 | 4/2014 | Vedder et al. | |
| 9,620,184 B1 | 4/2017 | Bialas, Jr. et al. | |
| 2008/0126690 A1 | 5/2008 | Rajan et al. | |
| 2015/0169443 A1* | 6/2015 | Lee ..................... | G06F 12/0246 711/103 |
| 2017/0236569 A1* | 8/2017 | Sato ................... | G06F 13/1689 711/106 |
| 2019/0129818 A1 | 5/2019 | Kannan et al. | |

* cited by examiner

*Primary Examiner* — Tammara R Peyton
(74) *Attorney, Agent, or Firm* — Kowert, Hood, Munyon, Rankin & Goetzel, P.C.; Lawrence J. Merkel

(57) ABSTRACT

In an embodiment, a system includes an energy source and an integrated circuit that is coupled to one or more memory devices via a plurality of memory channels. A memory controller in the integrated circuit is programmable with a plurality of identifiers corresponding to the plurality of channels, and is further programmable with a command and a first identifier associated with the command. Responsive to the command, the memory controller is configured to perform one or more calibrations on a subset of the plurality of channels for which corresponding identifiers of the plurality of identifiers match the first identifier. Other ones of the plurality of channels, for which the corresponding identifiers do not match the first identifier, do not perform the calibration.

20 Claims, 6 Drawing Sheets

MEMORY CHANNELS CALIBRATION DURING BOOT WHEREIN CHANNELS ARE CALIBRATED IN PARALLEL BASED ON IDENTIFERS

BACKGROUND

Technical Field

Embodiments described herein are related to memory calibration, and more particularly to calibration during system initialization (boot).

Description of the Related Art

Various electronic devices make use of random access memory (RAM), such as static RAM (SRAM) or dynamic RAM (DRAM), for storage of data being operated upon by digital circuits in the system. For example, the data can be operated upon by various processors or other digital hardware circuits in the system. The processors can include general purpose processors serving as central processing units (CPUs) in the system. The processors can also include special purpose processors such as graphics processing units (GPUs), image signal processors (ISPs), digital signal processors (DSPs), etc. The processors can further include coprocessors or processors embedded in peripheral circuitry in the system. Other digital hardware circuits can include peripherals of various types. Data stored in RAM is generally accessible more quickly than data stored in non-volatile storage such as flash memory, various forms of hard drives (magnetic, optical, solid state, etc.), etc.

Modern versions of DRAM including double data rate (DDR) such as DDR4, DDR5, etc. and low power versions of such DRAMs (LP4, LP5, etc.) include high speed interfaces that require calibration for effective and error-free communication between the DRAM and other digital circuits. The calibration results are memory device-dependent and can also vary based on temperature, the speed (or clock frequency) at which the interface is operated when multiple speeds are supported, etc.

When a system is powered up, an initial calibration is performed on the memory devices in the system as part of the system initialization (also referred to as "boot"). If the system is powered up after being completely powered off, the boot is referred to as cold boot. In other cases, the system can be powered up from a low power mode in which a significant portion of the digital circuitry was powered off but some circuits remained powered on ("warm boot").

To quickly proceed through boot and make the system available to the user, it is desirable to perform memory calibration rapidly. For example, there can be multiple channels of access to the memory system, and calibration on the channels can be performed in parallel. However, in systems that are used in mobile devices that have a finite energy source such as a battery, it is possible in some cases that performing all channels in parallel will lead to an incorrect result if there is not sufficient charge in the battery. The voltage supplied by the battery can droop significantly based on the amount of available charge, which can affect the calibration results and can even lead to incorrect operation while the calibration is being attempted, which can cause the boot process to fail.

SUMMARY

In an embodiment, a system includes an energy source and an integrated circuit that is coupled to one or more memory devices via a plurality of memory channels. A memory controller in the integrated circuit is programmable with a plurality of identifiers corresponding to the plurality of channels, and is further programmable with a command and a first identifier associated with the command. Responsive to the command, the memory controller is configured to perform one or more calibrations on a subset of the plurality of channels for which corresponding identifiers of the plurality of identifiers match the first identifier. Other ones of the plurality of channels, for which the corresponding identifiers do not match the first identifier, do not perform the calibration.

In an embodiment, the above system may perform calibrations during boot by reading a charge state from an energy source in the system (e.g. a battery) and determining a number of the plurality of channels that may perform the one or more calibrations in parallel based on the charge state. The more charge that is available in the energy source, the higher the determined number of the plurality of channels may be. Thus, the amount of parallelization of the calibrations may be matched to the charge state of the system. The process of reading the charge state, determining the number of channels, and programming identifiers corresponding to channels may be repeated until each channel has performed the specified calibrations. The initialization of the system may be performed as rapidly as the energy source may permit at the time of boot, while ensuring proper operation of the system and accurate calibration results.

BRIEF DESCRIPTION OF THE DRAWINGS

The following detailed description makes reference to the accompanying drawings, which are now briefly described.

Figure 1:
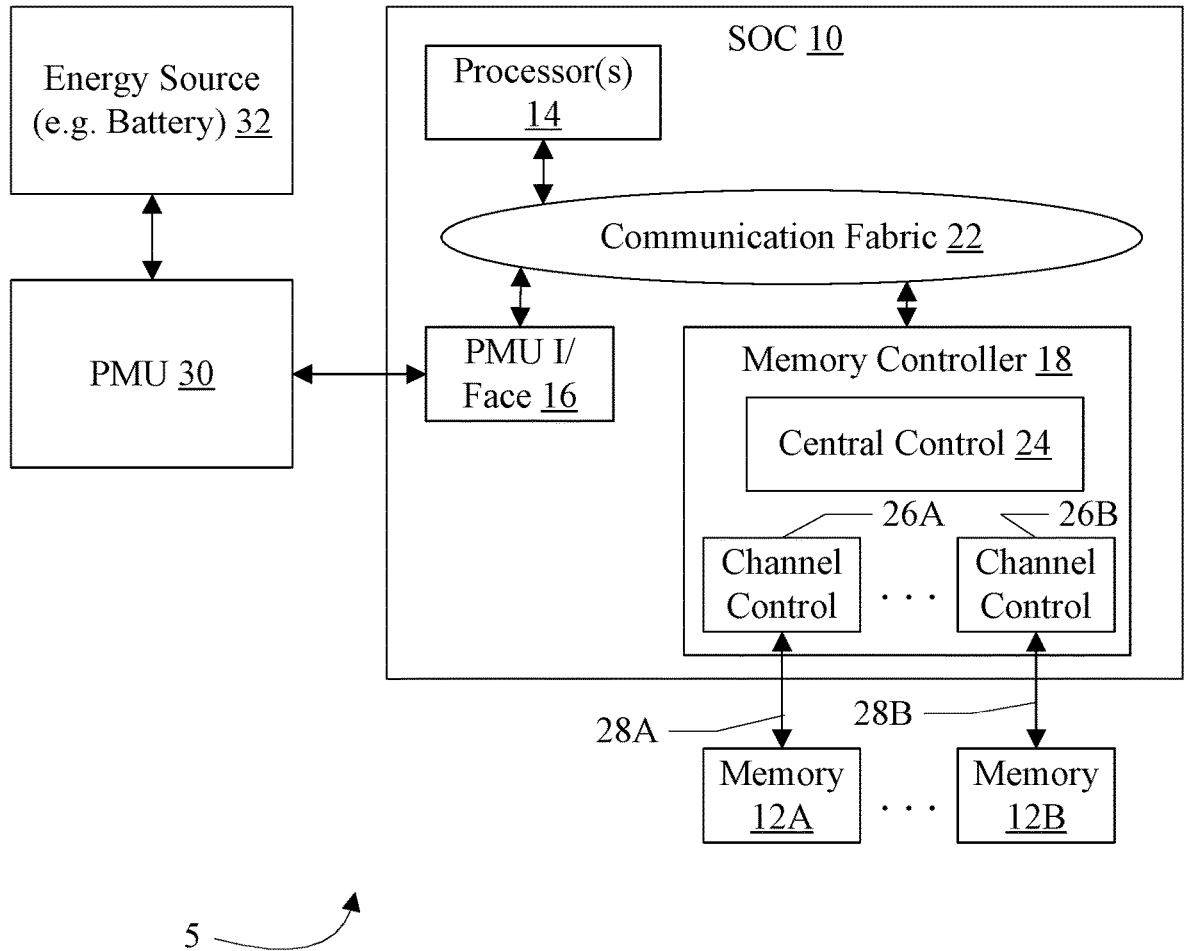
FIG. 1 is a block diagram of one embodiment of a system.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean "including, but not limited to." As used herein, the terms "first," "second," etc. are used as labels for nouns that they precede, and do not imply any type of ordering (e.g., spatial, temporal, logical, etc.) unless specifically stated.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "clock circuit configured to generate an output clock signal" is intended to cover, for example, a circuit that performs this function during operation, even if the circuit in question is not currently being used (e.g., power is not connected to it). Thus, an entity described or recited as "configured to" perform some task refers to something physical, such as a device, circuit, memory storing program instructions executable to implement the task, etc. This phrase is not used herein to refer to something intangible. In general, the circuitry that forms the structure corresponding to "configured to" may include hardware circuits. The hardware circuits may include any combination of combinatorial logic circuitry, clocked storage devices such as flops, registers, latches, etc., finite state machines, memory such as static random access memory or embedded dynamic random access memory, custom designed circuitry, analog circuitry, programmable logic arrays, etc. Similarly, various units/circuits/components may be described as performing a task or tasks, for convenience in the description. Such descriptions should be interpreted as including the phrase "configured to."

The term "configured to" is not intended to mean "configurable to." An unprogrammed FPGA, for example, would not be considered to be "configured to" perform some specific function, although it may be "configurable to" perform that function. After appropriate programming, the FPGA may then be said to be "configured" to perform that function.

Reciting in the appended claims a unit/circuit/component or other structure that is configured to perform one or more tasks is expressly intended not to invoke 35 U.S.C. § 112(f) interpretation for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

In an embodiment, hardware circuits in accordance with this disclosure may be implemented by coding the description of the circuit in a hardware description language (HDL) such as Verilog or VHDL. The HDL description may be synthesized against a library of cells designed for a given integrated circuit fabrication technology, and may be modified for timing, power, and other reasons to result in a final design database that may be transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and may further include other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA.

As used herein, the term "based on" or "dependent on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

This specification includes references to various embodiments, to indicate that the present disclosure is not intended to refer to one particular implementation, but rather a range of embodiments that fall within the spirit of the present disclosure, including the appended claims. Particular features, structures, or characteristics may be combined in any suitable manner consistent with this disclosure.

This specification may use the words "a" or "an" to refer to an element, or "the" to refer to the element. These words are not intended to mean that there is only one instance of the element. There may be more than one in various embodiments. Thus, "a", "an", and "the" should be interpreted to mean "one or more" unless expressly described as only one.

This specification may describe various components, units, circuits, etc. as being coupled. In some embodiments, the components, units, circuits, etc. may be coupled if they are electrically coupled (e.g. directly connected or indirectly connected through one or more other circuits) and/or communicatively coupled.

DETAILED DESCRIPTION OF EMBODIMENTS

Turning now to FIG. 1, a block diagram of one embodiment of a system 5 is shown. In the embodiment of FIG. 1, the system 5 may include an integrated circuit (IC) such as a system on a chip (SOC) 10 coupled to one or more memory devices 12A-12B. The system 5 may further include a power management unit (PMU) 30 coupled to the SOC 10 and an energy source 32 coupled to the PMU 30.

The SOC 10 may include various components, including the components shown in FIG. 1. As implied by the name, the components of the SOC 10 may be integrated onto a single semiconductor substrate as an integrated circuit "chip." In some embodiments, the components may be implemented on two or more discrete chips in the system 5. However, the SOC 10 will be used as an example herein. In the illustrated embodiment, the components of the SOC 10 include one or more processors 14. The processors 14 may be central processing units (CPUs), in an embodiment. In the illustrated embodiment, components of the SOC 10 further include a PMU interface circuit 16, a memory controller 18, and a communication fabric 22. The PMU interface circuit 16 may be an example of a peripheral component (or more briefly "peripheral"). Various other peripherals may be included (not shown in FIG. 1). The components 14, 16, and 18 may all be coupled to the communication fabric 22, and thus to each other for communication between the components. The memory controller 18 may be coupled to the memory devices 12A-12B during use.

The memory controller 18 may generally include the circuitry for receiving memory operations from the other components of the SOC 10 and for accessing the memory devices 12A-12B to complete the memory operations. The memory controller 18 may be configured to access any type of memory. For example, the memory devices 12A-12B may be static random access memory (SRAM), dynamic RAM (DRAM) such as synchronous DRAM (SDRAM) including double data rate (DDR, DDR2, DDR3, DDR4, DDR5 etc.) DRAM. Low power/mobile versions of the DDR DRAM may be supported (e.g. LP3 LP4, LP5, mDDR, etc.).

More particularly in FIG. 1, the memory controller 18 may include a central control circuit 24 and a plurality of channel control circuits such as channel control circuits 26A-26B. The central control circuit 24 may be coupled to the plurality of channel control circuits. Each channel control circuit 26 may be coupled to a respective memory channel 28A-28B to communicate with the memory devices 12A-12B. In some embodiments, more than one memory channel 28A-28B may be coupled to a given memory device 12A-12B. In other embodiments, more than one memory device 12A-12B may be grouped together and accessed via a memory channel 28A-28B. Still other embodiments may have a one-to-one correspondence of memory channels 28A-28B to memory devices 12A-12B.

A memory channel (or more briefly, "channel") may be an independent interface to a memory device. That is, a memory access may be performed independently on each channel, allowing multiple memory operations to be performed in parallel, up to the number of channels. Each channel may be a high-speed interface that may operate at clock frequencies in the Gigahertz range currently, although clock speeds often increase from generation to generation. There may be multiple clock speeds supported in different modes (e.g. lower power, lower performance modes may be used when there is less memory traffic to save power and higher power, higher performance modes may be used when there is more memory traffic).

Each channel may be calibrated, as the calibration results may vary from channel to channel due to manufacturing variations in the memory devices 12A-12B, differences in operating temperature, differences in the interconnect parasitic loads, etc. Accordingly, during boot, each memory channel may be calibrated. The channel control circuits 26A-26B may be configured to perform the calibrations on the respective memory channels 28A-28B.

The central control circuit 24 may be configured to coordinate calibrations by the channel control circuits 26A-26B. More particularly, boot code executing on the processors 14 may read the charge state of the energy source 32 (communicating over the communication fabric 22 to the PMU interface circuit 16 with the PMU 30). Based on the charge state, the boot code may determine how many channels may perform a given calibration in parallel. The boot code may program the channel control circuits 26A-26B and the central control circuit 24 to perform the calibrations in parallel over the determined number of channels, and may repeat the process of reading the charge state, determining the number of channels, and programming the channel control circuits 26A-26B and the central control circuit 24 until the plurality of channels 28A-28B have been calibrated. Additional details will be provided below.

The PMU 30 may be configured to interface with the energy source 32 and provide one or more regulated supply voltages to the SOC 10 (and other circuitry in the system 5, not shown). There may be multiple supply voltages generated by the PMU 30 for the SOC 10. For example, a voltage may be generated for the processors 14, and another voltage may be generated for other components in the SOC 10. In an embodiment, the other voltage may serve the memory controller 18, the peripherals, and the other components of the SOC 10 and power gating may be employed based on power domains. There may be multiple supply voltages for the rest of the SOC 10, in some embodiments. In some embodiments, there may also be a memory supply voltage for various memory arrays in the processors 14 and/or the SOC 10. The memory supply voltage may be used with the voltage supplied to the logic circuitry, which may have a lower voltage magnitude than that required to ensure robust memory operation.

The energy source 32 may generally include any device that is capable of providing electrical energy (e.g. voltage and current) for the operation of the system 5. The energy source 32 may store electrical energy previously provided to the source, or may generate electrical energy through chemical reaction, solar generation, kinetic energy, etc. For example, the energy source 32 may include a battery. The battery may include any type of electrical energy storage such as lithium ion batteries, nickel-cadmium batteries, etc. The energy source 32 may include essentially infinite sources such as a connector plugged into a wall outlet. The energy source 32 may include combinations of sources, such as a battery and circuitry to plug into a wall outlet to charge the battery. Alternatively, charging circuitry in the energy source 32 may include wireless charging (e.g. through magnetic inductance), charging from other sources such as solar, etc.

The charge state of the energy source 32 may be a measure of the available charge that can presently be supplied through the PMU to the SOC 10, the memory devices 12A-12B, and other components of the system 5 (not shown). When the charge state is high (e.g. a battery that is closer to fully charged), the amount of energy that can be delivered may be higher than if the charge state is low (e.g. a battery that is closer to discharged). Thus, in the case of calibrating the memory channels, the number of channels that may be successfully and accurately calibrated in parallel may be based on the charge state of the energy source.

As mentioned above, the PMU interface circuit 16 may provide a communication interface to the PMU 30, and thus may be an example of a peripheral in the SOC 10. Other peripherals may be provided. Such peripherals may be any set of additional hardware functionality included in the SOC 10. For example, the peripherals may include video peripherals such as an image signal processor configured to process image capture data from a camera or other image sensor, display controllers configured to display video data on one or more display devices, graphics processing units (GPUs), video encoder/decoders, scalers, rotators, blenders, etc. The peripherals may include audio peripherals such as microphones, speakers, interfaces to microphones and speakers, audio processors, digital signal processors, mixers, etc. The peripherals may include interface controllers for various interfaces external to the SOC 10, including interfaces such as Universal Serial Bus (USB), peripheral component interconnect (PCI) including PCI Express (PCIe), serial and parallel ports, etc. The peripherals may include networking peripherals such as media access controllers (MACs). Any set of hardware may be included.

The processors 14 generally may include one or more processor cores that act as the CPUs of the SOC 10. The CPUs may generally execute the software that controls overall operation of the system (e.g. operating system software) and various application software that provides the functionality desired in the system. The processors may implement any desired instruction set architecture and may have any design (e.g. superscalar, pipelined, or superpipelined designs; in order or out of order designs; speculative or non-speculative designs; etc.). Various performance enhancing circuitry may be implemented (e.g. branch prediction, register renaming, reorder buffers, reservation stations, centralized schedulers, caches, etc.). Different instances of the processors 14 in the SOC 10 may have different designs (e.g. high-performance designs and energy efficient designs). Processors may use various microcoding techniques, in addition to or instead of the other design features mentioned above. The processors 14 may be arranged in one or more clusters with any combination of shared and private caches in a cache hierarchy.

The communication fabric 22 may be any communication interconnect and protocol for communicating among the components of the SOC 10. The communication fabric 22 may be bus-based, including shared bus configurations, cross bar configurations, and hierarchical buses with bridges. The communication fabric 22 may also be packet-based, and may be hierarchical with bridges, cross bar, point-to-point, or other interconnects.

It is noted that the number of components of the SOC 10 may vary from embodiment to embodiment. There may be more or fewer of each component than the number shown in FIG. 1. For example, there may be more memory channels 28A-28B, channel control circuits 26A-26B, and memory devices 12A-12B in other embodiments. Memory controllers that support 4, 8, or 16 channels may be supported, for example, or even more channels. Other embodiments may include multiple memory controllers in the SOC 10, and/or more than one SOC 10, each supporting any desired number of memory channels.

Figure 2:
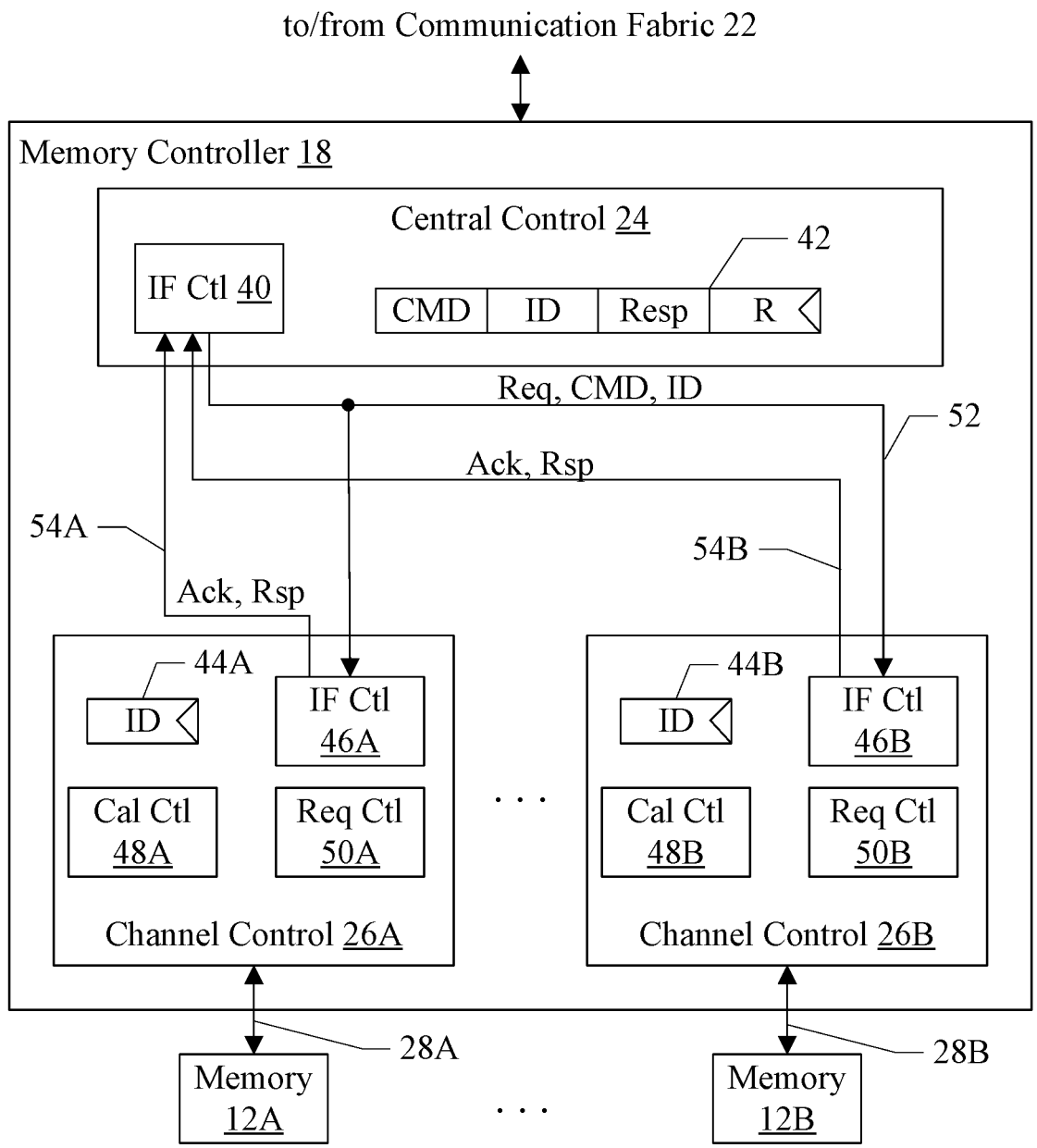
FIG. 2 is a block diagram of one embodiment of a memory controller shown in FIG. 1 in greater detail.

Turning now to FIG. 2, a block diagram illustrating one embodiment of the memory controller 18 in greater detail is shown. The central control circuit 24 includes an interface control circuit 40 and a command register 42. The channel control circuits 26A-26B include respective identifier (ID) registers 44A-44B, respective interface control circuits 46A-46B, respective calibration control circuits 48A-48B, and respective request control circuits 50A-50B. The interface control circuit 40 and the interface control circuits 46A-46B are coupled to a calibration interface that includes, in this embodiment, a broadcast transmission interconnect 52 from the interface control circuit 40 to the interface control circuits 46A-46B and respective response interconnect 54A-54B from each channel circuit 46A-46B to the interface control circuit 40.

The command register 42 may include a variety of fields in various embodiments. In the illustrated embodiment, the command register 42 may include a command field (CMD), an ID field (ID), a response field (Resp), a run indication (R). To transmit a calibration request, instructions executing on the processors 14 (e.g. boot code), may write the command register 42 with a command specifying one or more calibrations to perform, an ID to be matched to the ID registers 44A-44B, and a run indication in the run state to indicate that the calibrations are ready to perform. Prior to writing the command register 42, the instructions may write the ID registers 44A-44B of the channels to be calibrated with matching IDs to the ID field to be written to the command register 42. The remaining ID registers 44A-44B, corresponding to channels that are to be idle during the calibration, may be written to a different value or not written at all (e.g. the boot code may select a different ID for each calibration, thus obviating the need to write new values to ID registers of channels that have already been calibrated). In one embodiment, the ID field may be set to zero to cause a calibration of all channels in parallel. For example, an ID of zero may be treated as a wildcard that matches any ID in the ID registers 44A-44B.

The run indication may be any indication that can take on at least two values (run and not run). For example, the run indication may be a bit that may be set to indicate run and clear to indicate not run (or to indicate that the calibration is complete). The opposite senses of the bit may be used in other embodiments, or a multibit value may be used. In an embodiment, the boot code may set the run bit when writing a new command to the command register 42 (or subsequently, if additional preparation is needed before running the calibration) and the central control circuit 24 (and more particularly the interface control circuit 40) may clear the run bit when the calibration has finished. The boot code may poll the run bit to determine when the calibration is complete. In other embodiments, an interrupt to the processor may be supported when the interrupt is complete, or a different indication from the run bit may be used to indicate complete and may be polled by the processor. Any notification mechanism may be used in various embodiments.

The response field may be used to indicate a response to the calibration request. The central control circuit 24 (and more particularly, the interface control circuit 40) may write the value to the response field as a composite of the responses from the channel control circuits 26A-26B. Any composite may be used. For example, responses could be concatenated to provide a composite response. In one embodiment, the composite response matches the response that is more critical than other responses. For example, responses of ID mismatch (e.g. the channel was not selected to run the calibration), complete, and error may be supported. Error may be more critical than complete, which may be more critical than ID mismatch.

The interface control circuit 40 may be coupled to the command register 42, and may be configured to initiate a calibration in response to the setting of the run bit. The interface control circuit 40 may broadcast the command and the ID from the register 42, asserting a request signal to indicate that the request is valid on the broadcast interconnect 52 (Req in FIG. 2). Each of the interface control circuits 46A-46B may be coupled to the broadcast interconnect 52, and may be configured to compare the ID to the respective ID registers 44A-44B. If the ID matches, the interface control circuit 46A-46B may pass the command to the respective calibration control circuit 48A-48B and may assert the acknowledge (Ack) signal to the interface control circuit 40 on the respective response interconnect 54A-54B. The calibration control circuit 48A-48B may be configured to carry out the requested calibration operations on the channel 28A-28B and return a result of the calibration on the respective response interconnect 54A-54B (Rsp in FIG. 2). The interface control circuit 46A-46B may be configured to maintain assertion of the Ack signal until the calibration completes, at which time the interface control circuit 46A-46B may be configured to transmit the response from the calibration control circuit 48A-48B and to deassert the Ack signal. The deassertion of the Ack signal my indicate that the result of the calibration is available on the response interconnect 54A-54B from the interface control circuit 46A-46B.

A given calibration command may map to one calibration, or may map to multiple calibrations that may be performed together or as a sequence. A set of calibration commands and corresponding calibrations may be supported. Generally, calibrations may include reference voltage calibrations (in which a reference voltage is selected that leads to a wide data eye for data being read/written), various delay lock loop trainings or other clock generator trainings, read and write calibration, write leveling calibration, command bus training, read gate training, duty cycle corrector (DCC) calibration, and continuous time linear equalization (CLTE) calibration.

While the calibration control circuits 48A-48B are responsible for the calibration operations, the request control circuits 50A-50B may be configured to perform memory requests on the channels 28A-28B during normal operation. Generally, the memory controller 18 may include queues for memory operations, for ordering (and potentially reordering) the operations and presenting the operations to the memory devices 12A-12B. The memory controller 18 may further include data buffers to store write data awaiting write to memory and read data awaiting return to the source of the memory operation. In some embodiments, the memory controller 18 may include a memory cache to store recently accessed memory data. In SOC implementations, for example, the memory cache may reduce power consumption in the SOC by avoiding reaccess of data from the memory 12 if it is expected to be accessed again soon. In some cases, the memory cache may also be referred to as a system cache, as opposed to private caches such as the shared cache or caches in the processors, which serve only certain components. Additionally, in some embodiments, a system cache need not be located within the memory controller 18. The request control circuits 50A-50B may include the circuits configured to perform the above processing within each channel (e.g. memory request ordering, grouping of requests to efficiently use memory bandwidth, etc.).

Figure 3:
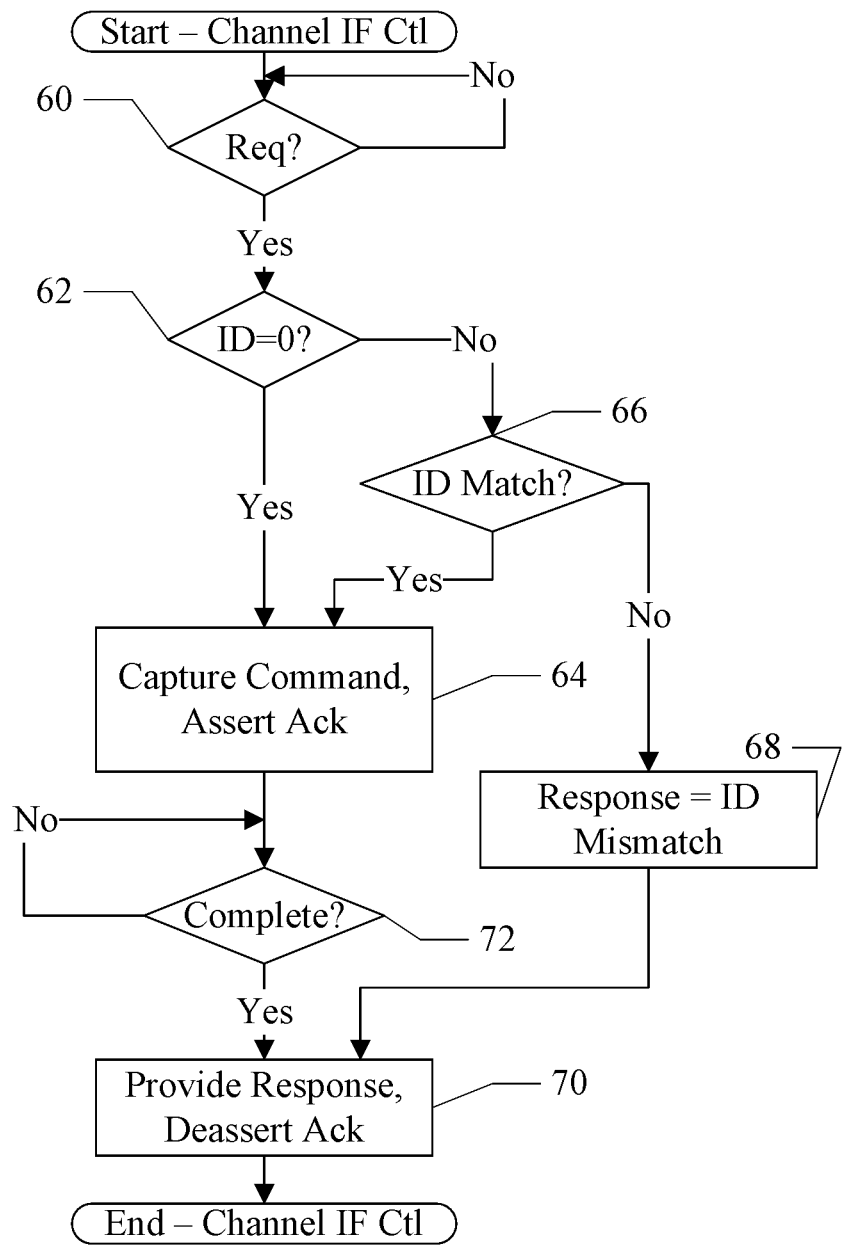
FIG. 3 is a flowchart illustrating certain operation of one embodiment of a channel interface control circuit shown in FIG. 2.

Turning next to FIG. 3, a flowchart is shown illustrating operation of one embodiment of the channel interface control circuits 46A-46B. While the blocks are shown in a particular order for ease of understanding, other orders may be used. Blocks may be performed in parallel in combinatorial logic in the interface control circuits 46A-46B. Blocks, combinations of blocks, and/or the flowchart as a whole may be pipelined over multiple clock cycles. The interface control circuits 46A-46B may be configured to implement the operation shown in FIG. 3.

When the a given interface control circuit 46A-46B is idle, the circuit may await assertion of the request signal from the interface control circuit 40. If the request signal is not asserted (decision block 60, "no" leg), the given interface control circuit 46A-46B remains idle. If the request signal is asserted (decision block 60, "yes" leg), the given interface control circuit 46A-46B may examine the ID transmitted by the interface control circuit 40. In one embodiment, a predetermined value of the ID is an indication that the calibration is to be performed in parallel by all channels. For example, in this embodiment, the predetermined value may be zero. Other embodiments may use other values, e.g. the maximum value of the ID. The boot code may not use the predetermined value as a value programmed into the ID registers 44A-44B (e.g. the value is reserved for use as the "all channels in parallel" indication). If the ID is zero (decision block 62, "yes" leg), the ID is treated as an automatic ID match and processing continues with the given interface control circuit 46A-46B capturing the command and asserting Ack (block 64). If the ID is not zero (or the predetermined value—decision block 62, "no" leg), the given interface control circuit 46A-46B may compare the ID to the ID in the ID register 44A-44B. If the ID matches (decision block 66, "yes" leg), processing continues with the given interface control circuit 46A-46B capturing the command and asserting Ack (block 64). If the ID mismatches (e.g. does not match—decision block 66, "no" leg), the given interface control circuit 46A-46B may be configured to generate the ID mismatch response to the interface control circuit 40 (block 68), provide the response to the interface control circuit 40, and deassert Ack (block 70).

If the given interface control circuit 46A-46B determines that the channel is selected for calibration (ID=0 or ID matches the programmed ID for the channel), calibration may be performed on the corresponding channel 28A-28B. The given interface control circuit 46A-46B may be configured to provide the captured command to the calibration control circuit 48A-48B, which may be configured to initiate the calibration on the channel. The given interface control circuit 46A-46B may await the completion of the calibration (decision block 72). When the calibration is complete (decision block 72, "yes" leg), the calibration control circuit 48A-48B may be configured to provide the calibration result to the given interface control circuit 46A-46B. The given interface control circuit 46A-46B may provide the response to the interface control circuit 40, and deassert Ack (block 70).

Figure 4:
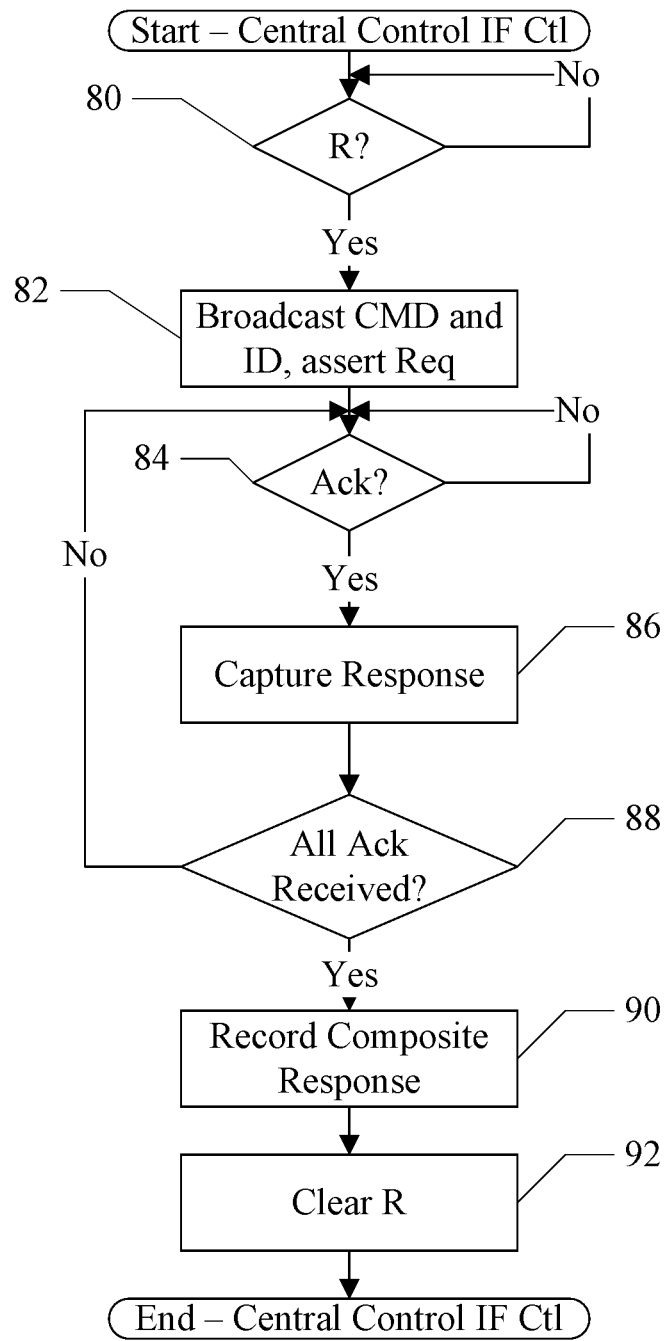
FIG. 4 is a flowchart illustrating certain operation of one embodiment of a central control interface control circuit shown in FIG. 2.

FIG. 4 is a flowchart illustrating operation of one embodiment of the central control interface control circuit 40. While the blocks are shown in a particular order for ease of understanding, other orders may be used. Blocks may be performed in parallel in combinatorial logic in the interface control circuit 40. Blocks, combinations of blocks, and/or the flowchart as a whole may be pipelined over multiple clock cycles. The interface control circuit 40 may be configured to implement the operation shown in FIG. 4.

When the interface control circuit 40 is idle, the interface control circuit 40 may be configured to check the run bit to determine if a new command has been provided in the register 42 (decision block 80). If the run bit is not set, the interface control circuit 40 remains idle (decision block 80, "no" leg). If the run bit is set (decision block 80, "yes" leg), the interface control circuit 40 may be configured to broadcast the command and ID from the register 42 to the channel control circuits 26A-26B (and more particularly the interface control circuits 46A-46B) on the broadcast interconnect 52. The interface control circuit 40 may also be configured to assert the request signal on the broadcast interconnect 52 to indicate the broadcast (block 82).

The interface control circuit 40 may be configured to monitor the responses from the channel control circuits 26A-26B on the response interconnect 54A-54B. In an embodiment, the channel control circuits 26A-26B/interface control circuits 46A-46B may be configured to assert the acknowledgement (Ack) responsive to capturing the command, and deassert the Ack responsive to completing processing of the command. The completion may be relatively quick, e.g. if the ID mismatches with the ID of the channel. The completion may be longer latency if the ID matches and the calibration is performed. If the interface control circuit 40 does not detect deassertion of an Ack (decision block 84, "no" leg), the interface control circuit 40 may continue monitoring the Acks. If the interface control circuit 40 does detect deassertion of at least one Ack (decision block 84, "yes" leg), the interface control circuit 40 may capture the response (block 86). Multiple Acks may be received in a clock cycle and the responses from such Acks may be captured in parallel. If one or more Acks have not been deasserted (decision block 88, "no" leg), the interface control circuit 40 may continue to monitor for Ack deassertion. If all Acks have been received (deasserted) (decision block 88, "yes" leg), the interface control circuit 40 may generate the composite response and write the response to the Resp field in the register 42 (block 90). The interface control circuit 40 may clear the run bit, indicating that the command is completed (block 92). Once the composite response is written and the R bit cleared, the interface control circuit 40 may be idle.

Figure 5:
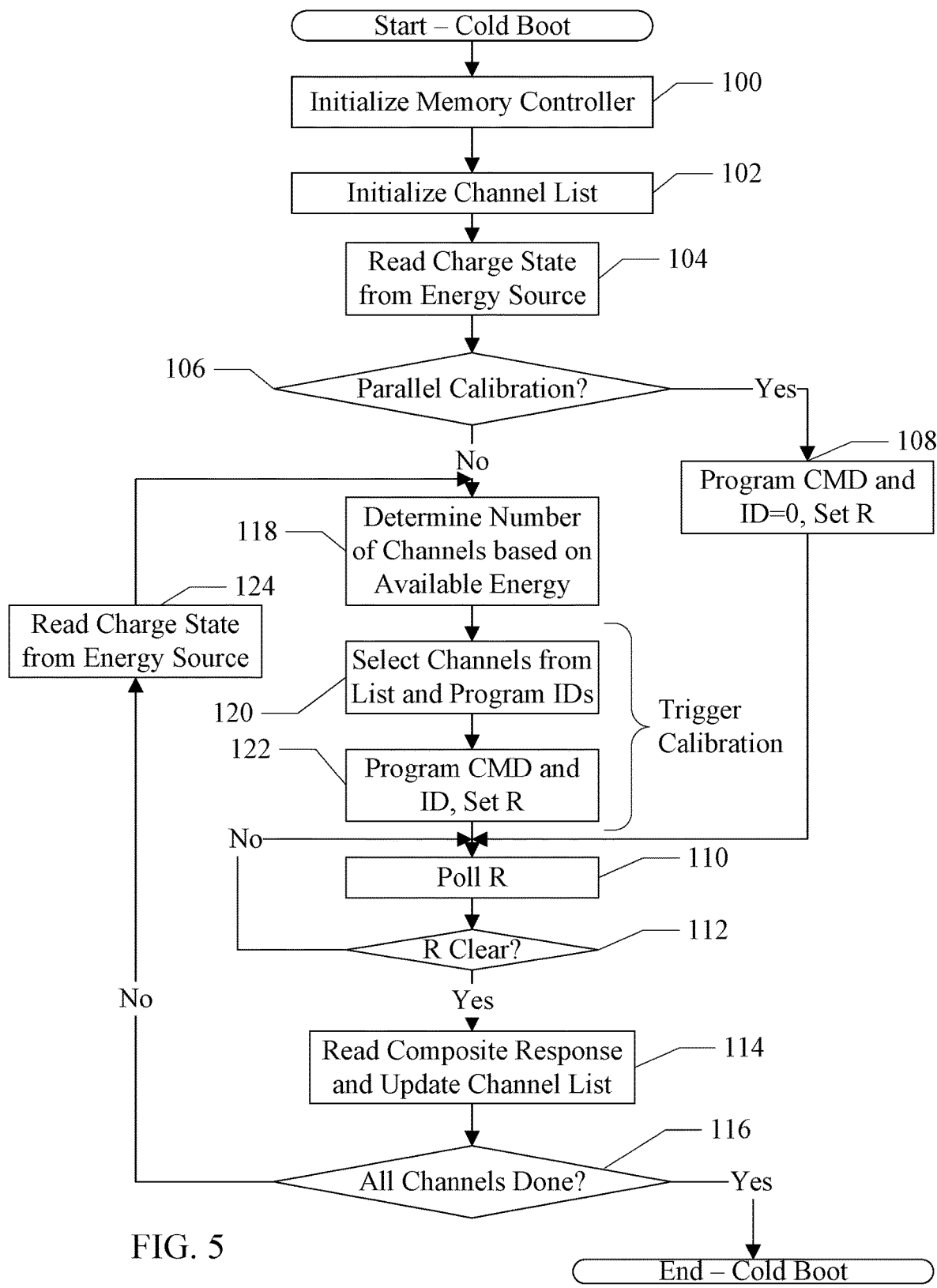
FIG. 5 is a flowchart illustrating certain operation of one embodiment of the system shown in FIG. 1.

FIG. 5 is a flowchart illustrating operation of one embodiment of boot code executed in the SOC 10 (e.g. by one or more processors 14) to calibrate the memory channels. While the blocks are shown in a particular order for ease of understanding, other orders may be used. Blocks, combinations of blocks, and/or the flowchart as a whole may occur over multiple clock cycles. The boot code may include instructions which, when executed on a processor 14, cause the SOC 10 to perform the operation shown in FIG. 5.

During cold boot, the boot code may initialize the memory controller 18 (block 100). The initialization needed may generally be implementation-dependent. For example, the initialization may include programming the ID registers 44A-44B to zero in each channel control circuit 26A-26B. The memory controller 18 may initially be configured to operate in the lowest performance state, which is safest prior to calibration. The boot code may initialize a list of channels for which calibration needs to be performed (block 102). The boot code may read the charge state from the energy source (block 104). The charge state may be encoded in any fashion (e.g. a percentage of full charge, an integer or floating point value indicating how much charge is available on a relative scale, an integer or floating point value indicating how much charge is available on an absolute scale, etc.). Based on the charge state, the boot code may determine if parallel calibration of all channels may be performed (decision block 106). For example, if the charge state indicates charge greater than a predefined threshold, parallel calibration may be performed. The predefined threshold may be a function of the total number of channels, the amount of current that a given calibration draws per channel, etc.

If parallel calibration may be performed (decision block 106, "yes" leg), the boot code may program the register 42 with the command, setting the ID field to zero (or other predetermined value that indicates that all channels are to perform the calibration in parallel). Programming the register 42 may trigger the calibration (block 108). The boot code may set the R bit to cause the calibration to start. The boot code may begin periodically polling the R bit in the register 42, waiting for the R bit to be cleared indicating that the command has been completed (block 110). If the R bit is not clear (decision block 112, "no" leg), the boot code may continue polling R. If the R bit is clear (decision block 112, "yes" leg), the boot code may read the composite response from the register 42 and update the channel list to indicate that the calibration has been completed for the channels (in this case, all the channels). The boot code may record the composite result for later analysis, or may analyze the composite response for error or other issues that may be corrected by the boot code, in various embodiments (block 114). In this case, all channels are complete and the boot code is finished (decision block 116, "yes" leg). Alternatively, additional calibrations may need to be performed and/or additional performance states of the memory controller 18 may need to be established and calibrated. In such cases, the boot code may establish the next state or determine the next calibration to be performed, and return to block 104 for further processing.

On the other hand, the charge state may indicate that parallel calibration of all channels may not be supported. In such cases (decision block 106, "no" leg), the boot code may determine the number of channels that may be calibrated in parallel based on the charge state (the available energy) (block 118). The boot code may have a table to threshold levels and numbers of channels, for example. The table may be developed through empirical observation at various charge states, through specification analysis (e.g. voltage droop at certain loads vs. charge state), etc. There may be a charge state at which only one channel may be calibrated at a time, and higher charge states it which varying numbers of channels may be calibrated in parallel. The boot code may select the determined number of channels from the channel list and may program the ID registers 44A-44B in those channels with an ID (block 120). For example, the ID may be 1 for the first iteration of selecting channels and causing the calibration on those channels, and the ID may be incremented for each subsequent iteration. Alternatively, the ID may be the maximum value for the first iteration and may be decremented for each subsequent iteration. By changing the ID each time (and initializing the ID registers 44A-44B as noted above with regard to block 100), only the registers of the channels that are selected for the current iteration need be programmed. The boot code may program the command and ID fields in the register 42 with the command specifying the calibration(s) and the assigned ID for this iteration, and may set the run bit (block 122). Together, selecting the channels and programming the ID for those channels and programming the register 42 (blocks 120 and 122) may trigger the calibration of the selected channels, while other channels remain idle (illustrated by the brace in FIG. 5). The boot code may begin periodically polling the R bit in the register 42, waiting for the R bit to be cleared indicating that the command has been completed (block 110). If the R bit is not clear (decision block 112, "no" leg), the boot code may continue polling R. If the R bit is clear (decision block 112, "yes" leg), the boot code may read the composite response from the register 42 and update the channel list to indicate that the calibration has been completed for the selected channels. The boot code may record the composite result for later analysis, or may analyze the composite response for error or other issues that may be corrected by the boot code, in various embodiments (block 114). If all channels are complete, the boot code is finished (decision block 116, "yes" leg). Alternatively, additional calibrations may need to be performed and/or additional performance states of the memory controller 18 may need to be established and calibrated. In such cases, the boot code may establish the next state or determine the next calibration to be performed, and return to block 104 for further processing. If additional channels remain in the channel list for which calibration has not been performed (decision block 116, "no" leg), the boot code may again read the charge state from the energy source (block 124) and perform another iteration of determining the number of channels, selecting channels, and programming the IDs and register 42 to trigger the next calibration (blocks 118 to 122). The charge state, and thus the number of channels, may vary from iteration to iteration. For example, the charge state may be more depleted after an iteration of calibration (and any other boot activities that may be performed in parallel with calibration). Thus, subsequent iterations may determine lower numbers of channels. Similarly, if the system is plugged into a wall outlet or other source to charge the energy source 32, the charge state may be higher in subsequent iterations and higher numbers of channels may be determined for subsequent iterations.

The flowchart of FIG. 5 illustrates operations related to calibration for the memory system. Other boot activities may be performed by the boot code, in parallel with the calibrations, before the calibrations, and/or after the calibrations.

Figure 6:
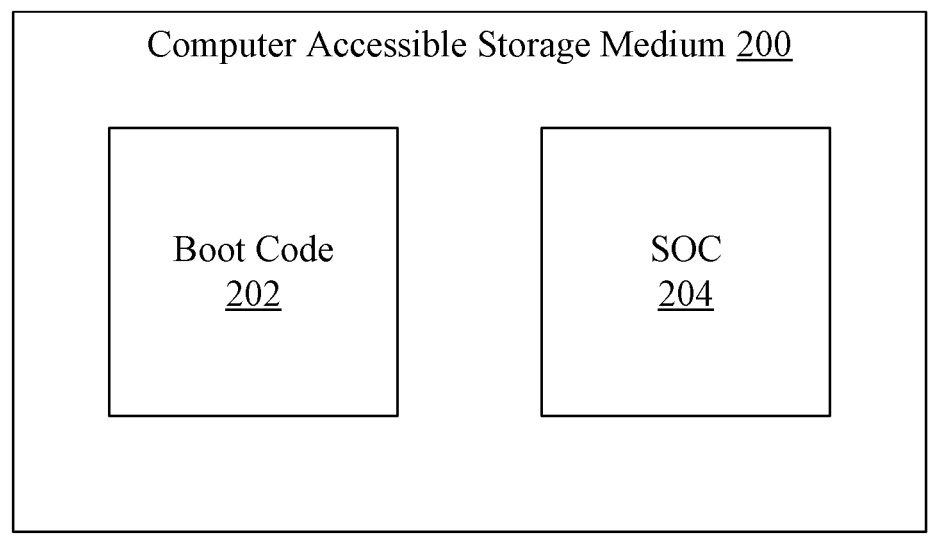
FIG. 6 is a block diagram of one embodiment of a computer accessible storage medium.

Turning now to FIG. 6, a block diagram of one embodiment of a computer readable storage medium 200 is shown. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g. synchronous dynamic RAM (SDRAM), Rambus DRAM (RDRAM), static RAM (SRAM), etc.), ROM, or Flash memory. The storage media may be physically included within the computer to which the storage media provides instructions/data. Alternatively, the storage media may be connected to the computer. For example, the storage media may be connected to the computer over a network or wireless link, such as network attached storage. The storage media may be connected through a peripheral interface such as the Universal Serial Bus (USB). Generally, the computer accessible storage medium 200 may store data in a non-transitory manner, where non-transitory in this context may refer to not transmitting the instructions/data on a signal. For example, non-transitory storage may be volatile (and may lose the stored instructions/data in response to a power down) or non-volatile.

The computer accessible storage medium 200 in FIG. 6 may store code forming boot code 202. The boot code 202 may comprise instructions which, when executed, implement the operation described above for these components. Particularly, the bot code 202 may include instructions which, when executed on the system 10, implement the operation of FIG. 5. A carrier medium may include computer accessible storage media as well as transmission media such as wired or wireless transmission.

The computer accessible storage medium 200 in FIG. 6 may also store a database 204 representative of the SOC 10. Generally, the database 204 may be a database which can be read by a program and used, directly or indirectly, to fabricate the hardware comprising the SOC 10. For example, the database may be a behavioral-level description or register-transfer level (RTL) description of the hardware functionality in a high-level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising the SOC 10. The netlist may then be placed and routed to produce a data set describing geometric shapes to be applied to masks. The masks may then be used in various semiconductor fabrication steps to produce a semiconductor circuit or circuits corresponding to the SOC 10. Alternatively, the database 204 on the computer accessible storage medium 200 may be the netlist (with or without the synthesis library) or the data set, as desired.

While the computer accessible storage medium 200 stores a representation of the SOC 10, other embodiments may carry a representation of any portion of the SOC 10, as desired, including any subset of the processors 14, the memory controller 18, the PMU interface circuit 16, the communication fabric 22, other components and/or peripherals, etc. The database 204 may represent any portion of the above. The database 204 may represent other portions of the system 5 as well (e.g. the memory devices 12A-12B, the PMU 30, etc.).

In accordance with this description, an embodiment of a method has been described. The method may comprise reading a charge state from an energy source in an electronic device during boot of the electronic device. The method may also comprise determining a number of a plurality of memory channels to calibrate in parallel based on the charge state. The memory may further comprise triggering a calibration on the number of the plurality of memory channels in parallel while a remaining number of the plurality of memory channels are idle. The method may still further comprise repeating the reading, determining, and triggering for one or more additional iterations until the plurality of memory channels are calibrated. The number of the plurality of memory channels on a first iteration and the number of the plurality of channels on a second iteration may differ when the charge state differs. The triggering may comprise programming the selected channels of the plurality of channels to be calibrated in parallel with an identifier, wherein non-selected channels of the plurality of channels are not programmed with the identifier, and transmitting a command including the identifier to trigger the calibration. The transmitting may comprise writing the command including the identifier to a memory controller that includes the plurality of channels; and broadcasting the command with the identifier by the memory controller to control circuitry associated with the plurality of channels. The method may further comprise comparing the identifier to a first identifier programmed into a first channel of the plurality of channels by a first control circuit associated with the first channel. The method may still further comprise performing the calibration responsive to a match in the comparing; and responding with a result of the calibration responsive to completing the calibration. The method may comprise responding with an identifier mismatch indication responsive to a mismatch in the comparing.

Additionally, the foregoing description includes an embodiment of a memory controller comprising a control circuit that comprises a command register and a plurality of channel control circuits coupled to the control circuit. A given channel control circuit of the plurality of channel control circuits includes an identifier register that is programmable with a first identifier. The given channel control circuit is coupled to a memory channel to a memory during use. The command register is programmable with a command and a second identifier. The control circuit is configured to broadcast the command and the second identifier to the plurality of channel control circuits. The given channel control circuit is configured to perform a calibration on the memory channel responsive to the command and the second identifier matching the first identifier. The given channel control circuit may be configured not to perform the calibration responsive to the command and the second identifier mismatching the first identifier. The given channel control circuit may be configured to respond to the command with an identifier mismatch response responsive to the second identifier mismatching the first identifier. The given channel control circuit may be configured to respond to the command with a result of the calibration. The control circuit may be configured to collect responses from the plurality of channel control circuits and to generate a composite response from the responses. The control circuit may be configured to write the composite response to the command register. The command register may include a first indication to cause the control circuit to perform the command. The control circuit may be configured to broadcast the command to the plurality of channel control circuits responsive to the first indication. The control circuit may be configured to change the first indication responsive to writing the composite response to the command register to indicate that the command is complete. The composite response may be error responsive to the response from at least one of the plurality of channel control circuits indicating error. The composite response may be complete responsive to none of the responses from the plurality of channel control circuits indicating error. The plurality of channel control circuits may be configured to perform the calibration in parallel responsive to the command and the second identifier having a predetermined value that is not matched to the first identifier.

Still further, an embodiment of a system is described comprising an energy source; a power management unit coupled to the energy source; one or more memory devices; and an integrated circuit coupled to the power management unit. The integrated circuit includes a plurality of channels coupled to the one or more memory devices. The integrated circuit comprises a memory controller coupled to the plurality of channels, wherein the memory controller is programmable with a plurality of identifiers corresponding to the plurality of channels. The memory controller is programable with a command specifying one or more calibrations to be performed and a first identifier. The memory controller is configured to perform the one or more calibrations on a subset of the plurality of channels for which the first identifier matches a corresponding one of the plurality of identifiers while remaining ones of the plurality of channels that are not in the subset do not perform the calibration. The integrated circuit may include at least one processor configured to execute a plurality of instructions to program the memory controller and to communicate with the power management unit to determine a charge state in the energy source to program the plurality of identifiers. In an embodiment, the energy source may comprise a battery.

Numerous variations and modifications will become apparent to those skilled in the art once the above disclosure is fully appreciated. It is intended that the following claims be interpreted to embrace all such variations and modifications.

What is claimed is:

1. A method comprising:
   reading a charge state from an energy source in an electronic device during boot of the electronic device;
   determining a number of a plurality of memory channels to calibrate in parallel based on the charge state;
   triggering a calibration on the number of the plurality of memory channels in parallel while a remaining number of the plurality of memory channels are idle; and
   repeating the reading, determining, and triggering for one or more additional iterations until the plurality of memory channels are calibrated, wherein triggering the calibration comprises:
      programming selected channels of the plurality of memory channels to be calibrated in parallel with an identifier, wherein non-selected channels of the plurality of memory channels are not programmed with the identifier;
      writing a command including the identifier to a memory controller that includes the plurality of memory channels; and
      broadcasting the command with the identifier by the memory controller to control circuitry associated with the plurality of memory channels.

2. The method as recited in claim 1 wherein the number of the plurality of memory channels on a first iteration and the number of the plurality of memory channels on a second iteration differ when the charge state differs.

3. The method as recited in claim 1 further comprising:
   comparing the identifier to a first identifier programmed into a first channel of the plurality of memory channels by a first control circuit associated with the first channel.

4. The method as recited in claim 3 further comprising:
   performing the calibration responsive to a match in the comparing; and
   responding with a result of the calibration responsive to completing the calibration.

5. The method as recited in claim 3 further comprising responding with an identifier mismatch indication responsive to a mismatch in the comparing.

6. A memory controller comprising:
   a control circuit comprising a command register; and
   a plurality of channel control circuits coupled to the control circuit, wherein:
      a given channel control circuit of the plurality of channel control circuits includes an identifier register,
      the given channel control circuit is coupled to a memory channel to a memory during use,
      the identifier register is programmable with a first identifier,
      the command register is programmable with a command and a second identifier,
      the control circuit is configured to broadcast the command and the second identifier to the plurality of channel control circuits, and
      the given channel control circuit is configured to perform a calibration on the memory channel responsive to the command and the second identifier matching the first identifier.

7. The memory controller as recited in claim 6 wherein the given channel control circuit is configured not to perform the calibration responsive to the command and the second identifier mismatching the first identifier.

8. The memory controller as recited in claim 7 wherein the given channel control circuit is configured to respond to the command with an identifier mismatch response responsive to the second identifier mismatching the first identifier.

9. The memory controller as recited in claim 8 wherein the given channel control circuit is configured to respond to the command with a result of the calibration.

10. The memory controller as recited in claim 9 wherein the control circuit is configured to collect responses from the plurality of channel control circuits and generate a composite response from the responses, wherein the control circuit is configured to write the composite response to the command register.

11. The memory controller as recited in claim 10 wherein the command register includes a first indication to cause the control circuit to perform the command, wherein the control circuit is configured to broadcast the command to the plurality of channel control circuits responsive to the first indication.

12. The memory controller as recited in claim 11 wherein the control circuit is configured to change the first indication responsive to writing the composite response to the command register to indicate that the command is complete.

13. The memory controller as recited in claim 10 wherein the composite response is error responsive to the response from at least one of the plurality of channel control circuits indicating error.

14. The memory controller as recited in claim 13 wherein the composite response is complete responsive to none of the responses from the plurality of channel control circuits indicating error.

15. The memory controller as recited in claim 6 wherein the plurality of channel control circuits are configured to perform the calibration in parallel responsive to the command and the second identifier having a predetermined value that is not matched to the first identifier.

16. A system comprising:
an energy source;
a power management unit coupled to the energy source;
one or more memory devices; and
an integrated circuit coupled to the power management unit, wherein the integrated circuit includes a plurality of channels coupled to the one or more memory devices, and wherein the integrated circuit comprises a memory controller coupled to the plurality of channels, wherein the memory controller is programmable with a plurality of identifiers corresponding to the plurality of channels, and wherein the memory controller is programmable with a command specifying one or more calibrations to be performed and a first identifier, wherein the memory controller is configured to broadcast the command and the first identifier to a plurality of channel control circuits coupled to the plurality of channels, and wherein the plurality of channel control circuits are configured to perform the one or more calibrations on a subset of the plurality of channels for which the first identifier matches a corresponding one of the plurality of identifiers while remaining ones of the plurality of channels that are not in the subset do not perform the calibration.

17. The system as recited in claim 16 wherein the integrated circuit includes at least one processor configured to execute a plurality of instructions to program the memory controller and to communicate with the power management unit to determine a charge state in the energy source to program the plurality of identifiers.

18. The system as recited in claim 16 wherein the energy source comprises a battery.

19. The system as recited in claim 16 wherein a given channel control circuit of the plurality of channel control circuits is configured to respond to the command with a result of the calibration based on a match between the first identifier and a corresponding identifier of the plurality of identifiers, and wherein the given channel control circuit is configured to respond to the command with an identifier mismatch response based on the first identifier mismatching with the corresponding identifier.

20. The system as recited in claim 19 wherein the given channel control circuit is configured to collect responses from the plurality of channel control circuits and generate a composite response from the responses, wherein the composite response is error responsive to the response from at least one of the plurality of channel control circuits indicating error, and wherein the composite response is complete responsive to none of the responses from the plurality of channel control circuits indicating error.

\* \* \* \* \*